(12) United States Patent
Huang et al.

(10) Patent No.: US 8,822,312 B2
(45) Date of Patent: Sep. 2, 2014

(54) METHOD OF FORMING HIGH GROWTH RATE, LOW RESISTIVITY GERMANIUM FILM ON SILICON SUBSTRATE

(75) Inventors: Yi-Chiau Huang, Fremont, CA (US); Errol Antonio C. Sanchez, Tracy, CA (US); Xianzhi Tao, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 100 days.

(21) Appl. No.: 13/482,725

(22) Filed: May 29, 2012

(65) Prior Publication Data
US 2012/0306055 A1 Dec. 6, 2012

Related U.S. Application Data

(60) Provisional application No. 61/493,264, filed on Jun. 3, 2011.

(51) Int. Cl.
*H01L 29/861* (2006.01)

(52) U.S. Cl.
USPC .......................................... 438/482; 438/301

(58) Field of Classification Search
USPC ................................................ 438/482, 301
See application file for complete search history.

(56) References Cited

U.S. PATENT DOCUMENTS

| 6,380,601 | B1 | 4/2002 | Ermer et al. |
| 7,919,381 | B2 | 4/2011 | Nayfeh et al. |
| 2007/0231488 | A1 | 10/2007 | Von Kaenel |
| 2008/0268615 | A1 | 10/2008 | Allibert et al. |
| 2011/0089415 | A1 | 4/2011 | Han et al. |

OTHER PUBLICATIONS

U.S. Appl. No. 13/482,585.*

* cited by examiner

*Primary Examiner* — Samuel Gebremariam
(74) *Attorney, Agent, or Firm* — Patterson & Sheridan, LLP

(57) ABSTRACT

A method of forming a doped semiconductor layer on a substrate is provided. A foundation layer having a crystal structure compatible with a thermodynamically favored crystal structure of the doped semiconductor layer is formed on the substrate and annealed, or surface annealed, to substantially crystallize the surface of the foundation layer. The doped semiconductor layer is formed on the foundation layer. Each layer may be formed by vapor deposition processes such as CVD. The foundation layer may be germanium and the doped semiconductor layer may be phosphorus doped germanium.

19 Claims, 3 Drawing Sheets

METHOD OF FORMING HIGH GROWTH RATE, LOW RESISTIVITY GERMANIUM FILM ON SILICON SUBSTRATE

CROSS-REFERENCE TO RELATED APPLICATIONS

This application claims benefit of U.S. Provisional Application Ser. No. 61/493,264, filed Jun. 3, 2011, and incorporated herein by reference.

BACKGROUND OF THE INVENTION

1. Field of the Invention

Embodiments described herein relate to semiconductor manufacturing processes. More specifically, embodiments described herein relate to improved methods of forming a doped semiconductor layer on a substrate.

2. Description of the Related Art

Germanium was one of the first materials used for semiconductor applications such as CMOS transistors. Due to vast abundance of silicon compared to germanium, however, silicon has been the overwhelming semiconductor material of choice for CMOS manufacture. Germanium, however, has many properties as a semiconductor that are superior to those of silicon. Germanium has, for example, better electron mobility and lower resistivity under doping than silicon. This has led to renewed interest in germanium as a semiconductive medium for various electronic applications. One such application is logic devices.

Parts of the logic gate where electron mobility is desired include the source, drain, and channel regions of the transistor structure. P-doped and n-doped semiconductor materials are separated by an undoped channel region such that application of an electric field near the channel region causes electrons to flow from the n-doped source to the p-doped drain regions. Good electron mobility encourages good response to the gate voltage. Use of germanium in such regions is therefore preferred over silicon.

In most cases, logic devices are formed on silicon substrates due to the low cost of silicon and its relative structural compatibility with the materials of the logic device and its general processability when forming other devices. When forming a doped germanium layer on silicon, the germanium layer is commonly implanted with dopants, and the resulting layer annealed to activate dopants and repair structural disruption caused by the implantation. Resistivity of the resulting doped material is reduced by incorporation of dopants in the crystal structure and ordering of the matrix.

Epitaxial formation of in-situ doped layers promises to eliminate the structural disruption caused by implantation, because the doped layer is formed without implantation. Epitaxial formation of doped germanium on silicon, however, leaves some residual disorder of the deposited layer due to structural incompatibility of germanium and silicon. The doped layer is typically annealed to remove the residual disorder, but the anneal encourages diffusion of dopants in the germanium layer into the underlying silicon, degrading the electrical properties of the resulting device. A process of forming a doped germanium layer is needed that avoids the unwanted diffusion.

SUMMARY OF THE INVENTION

Embodiments described herein provide a method of treating a semiconductor substrate by forming a barrier layer on the substrate, annealing the barrier layer, and forming an isomorphic doped layer on the annealed barrier layer. In some cases, the barrier layer is a foundation layer.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
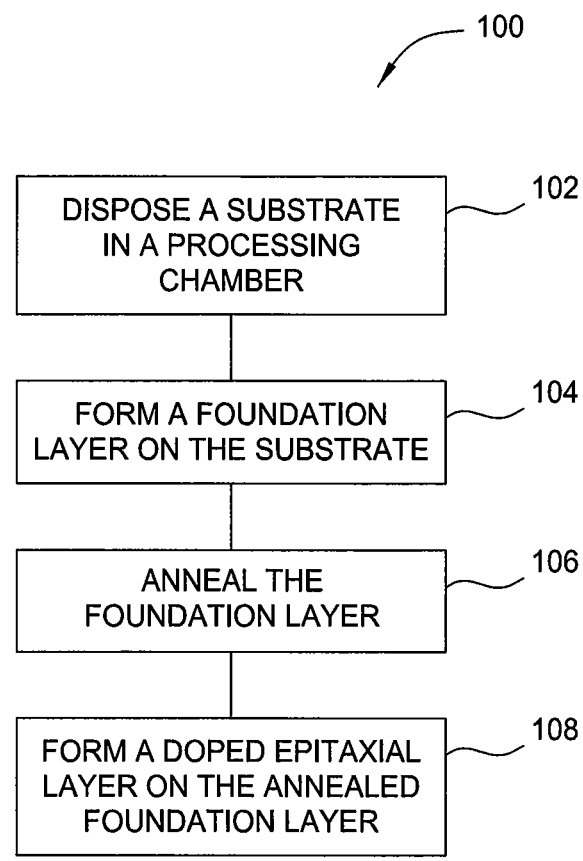
FIG. 1 is a flow diagram summarizing a method according to one embodiment.

FIG. 1 is a flow diagram summarizing a method 100 according to one embodiment. The method 100 may be used to form a doped crystalline semiconductor layer on a semiconductor substrate. At 102, a substrate is disposed in a processing chamber. The substrate may be any semiconductor substrate on which a doped crystalline semiconductor layer is to be formed. Substrates that may be subjected to the method 100 include elemental semiconductors and compound semiconductors, glasses, ceramics, and the like. Silicon, germanium, mixtures of silicon and germanium, group III/V compound semiconductors with mixtures of aluminum, gallium, indium, tellurium, nitrogen, phosphorus, and arsenic, group II/VI compound semiconductors with mixtures of zinc, cadmium, mercury, sulfur, selenium, and tellurium, and mixtures of all the above into hybrid semiconductors may be used. Glasses such as silicon oxides, with or without impurities and/or dopants, may be used.

The processing chamber may be a vapor deposition chamber such as a CVD or PVD chamber. PECVD, ALD, PEALD, and epitaxy chambers may be used. In one embodiment, the CENTURA® RP Epitaxy chamber available from Applied Materials, Inc., of Santa Clara, Calif., may be used to practice the methods encompassed by FIG. 1.

At 104, a foundation layer is formed on the substrate. The foundation layer provides a crystal structure on which a reduced resistivity doped layer may be formed in-situ. Forming a layer having a substantially isomorphic structure to the foundation layer promotes low resistivity with minimal, or no, subsequent annealing. In the case of doped layers, the minimal subsequent annealing reduces dopant diffusion. The foundation layer is typically a semiconductor layer, and may be any of the semiconductor materials described above. In one embodiment, the foundation layer is germanium. The foundation layer is generally formed in a CVD or PECVD process, but any convenient vapor deposition process, including ALD, PEALD, and LPCVD may also be used. One or more compounds containing the materials to be deposited are provided to the chamber containing the substrate and encouraged to deposit a layer on the substrate.

The foundation layer is typically formed from a material that resembles the doped layer above. For example, if the doped layer is to be a doped silicon layer, the foundation layer will be silicon. If the doped layer is to be a doped germanium layer, the foundation layer will be germanium. This similarity of materials provides a high quality interface between the foundation layer and the adjacent doped layer that in some embodiments is essentially continuous. The high quality interface results in excellent adhesion and low electrical losses. A semiconductor precursor is flowed into the processing chamber containing the substrate, and reacted to form a layer of semiconductor material on the substrate.

In one embodiment, germanium is deposited as a foundation layer by providing a process gas mixture comprising germanium to the processing chamber. A germanium compound, such as a germanium hydride (e.g. germane, digermane, trigermane, etc.) or an organogermanium compound, or a mixture of such compounds may be used. An exemplary germanium hydride compound is germane. A germanium hydride compound may be provided to the processing chamber as a dilute stream in hydrogen gas. On a volume basis, the dilute germanium hydride stream may be between about 3% and about 20% in hydrogen gas, such as between about 5% and about 15%, for example about 10%. Hydrogen gas may also be provided in a separate stream to the process chamber. For example, a stream of 10% germanium hydrides in hydrogen gas, by volume, may be provided to the process chamber at a flow rate between about 1 sLm and about 1.5 sLm and hydrogen gas may be provided separately to the process chamber at a flow rate between about 1 sLm and about 10 sLm to form a germanium layer on the substrate. The chamber is operated at a temperature below about 500° C., such as between about 300° C. and about 450° C., for example about 400° C., and a pressure between about 1 mTorr and about 100 Torr, such as between about 100 mTorr and about 50 Torr, for example about 20 Torr. The germanium layer is deposited to a thickness between about 10 Å and about 300 Å, such as between about 50 Å and about 200 Å, for example about 100 Å.

The ratio of hydrogen gas to germanium hydrides flowing into the reactor may be varied to affect deposition rate and properties of the deposited layer. The hydrogen gas may be provided at a first volumetric flow rate, on a total basis of hydrogen flowing with the germanium hydride plus added hydrogen. The germanium hydrides are provided at a second volumetric flow rate. The ratio of the first volumetric flow rate to the second volumetric flow rate is typically between about 5:1 and about 150:1, such as between about 10:1 and about 100:1, for example about 50:1. Increasing the ratio reduces deposition rate but increases the density and crystallinity of the deposited layer.

A gettering gas may also be provided to the processing chamber during formation of the foundation layer. The gettering gas consumes a portion of the growing layer to improve the quality of the layer. The gettering gas typically reacts with the material of the growing layer to form a volatile material that is removed from the chamber. A halide gas such as HCl, HF, or HI may be used as a gettering gas in embodiments featuring silicon or germanium. HCl, for example, may be used as a gettering gas when depositing a germanium foundation layer. The gettering gas preferentially reacts with poorly adhered atoms on the layer surface, increasing the proportion of strongly adhered, well-ordered atoms in the growing layer.

In the embodiment above, the gettering gas may be provided at a third volumetric flow rate, and a ratio of the second volumetric flow rate to the third volumetric flow rate may be between about 10:1 and 1000:1, such as between about 50:1 and about 500:1, for example about 100:1. In the germanium hydride embodiment described above, the gettering gas may be HCl gas, and may be provided at the above ratios.

At 106, the foundation layer is annealed. The annealing is generally performed by exposing the substrate with the foundation layer to electromagnetic radiation. The anneal may be performed by any thermal or radiant process. Thermal processes that may be used include heat soaking, baking, rapid thermal processing, spike annealing, and the like. Radiant processes that may be used include flash annealing, laser annealing, and microwave annealing. The laser annealing and microwave annealing may be continuous, pulsed, and/or stepped. During the annealing, the surface of the foundation layer may be melted in some embodiments.

A portion of the layer surface is heated to a temperature above a defect movement temperature of the foundation layer. For most materials, the temperature is above about 600° C., although in a microwave anneal process the temperature may be about 300° C. Defects remaining from formation of the foundation layer are removed and the structure of the layer brought to a substantially ordered crystalline state. The ordered surface of the foundation layer is then prepared to support ordered growth of a subsequent layer on top.

During the anneal, flow of process gases may be discontinued to stop growth of the foundation layer. Alternately, flow of hydrogen gas and semiconductor precursor may be maintained during the anneal, but a flow rate of the semiconductor precursor is generally reduced to slow growth of the foundation layer during the anneal.

In some embodiments, the anneal is a surface preparation that treats a portion of the foundation layer. In an embodiment wherein the foundation layer has a thickness greater than about 50 Å, a surface anneal designed to anneal only up to about 10 unit cells of depth, such as up to about 50 Å, may be used as a surface treatment of the foundation layer. Below the prepared surface, the foundation layer may have any residual morphology from crystalline to amorphous, without adversely affecting the properties of the doped layer formed on the prepared surface of the foundation layer.

In some embodiments, the foundation layer may be partially annealed. In embodiments wherein the inherent resistivity of the doped layer to be formed on the foundation layer is very low and crystallinity has only a minor effect on resistivity, a full anneal may not be needed to achieve a full benefit. For example, a heavily doped or regeneratively doped semiconductor layer has very low resistivity than a lightly doped semiconductor layer by virtue of the heavy doping. A heavily doped or regeneratively doped layer may be formed on a foundation layer that has been partially annealed with no significant loss of performance. Under such circumstances, the foundation layer may be subjected to annealing of between about 50% and about 99.9%, depending on the initial morphology of the foundation layer as deposited. In this context percent annealing is defined as one minus the ratio of final defect density to initial defect density, or as percent reduction in defect density, in the annealed material. The foundation layer may be annealed to between about 60% and about 90%, such as between about 70% and about 85%, for example about 80%. Partial annealing may be accomplished by adjusting time or temperature of any of the annealing processes mentioned above.

At 108, a doped layer is formed on the annealed foundation layer. The doped layer may be formed according to any process designed to grow an ordered layer structure using the ordered foundation layer surface as a template. The doped layer is thus isomorphic to the foundation layer. The doped layer may be formed by an epitaxial process in some embodiments. Generally, a semiconductor source and a dopant source are provided to a chamber containing a substrate, and the two sources are encouraged to deposit a doped semiconductor material on the substrate. In most cases, the semiconductor material is the same as the foundation layer material to maximize structural compatibility.

In an embodiment where a flow of the semiconductor source is maintained during annealing, such as the germanium example described above, a dopant source may be added to the process gas mixture to deposit the doped layer. The dopant may be any dopant advantageously included in a germanium layer, common examples of which are phosphorus, arsenic, and boron. Hydrides of phosphorus, arsenic, and boron, such as phosphines, arsines, and boranes, may be used.

Figure 2:
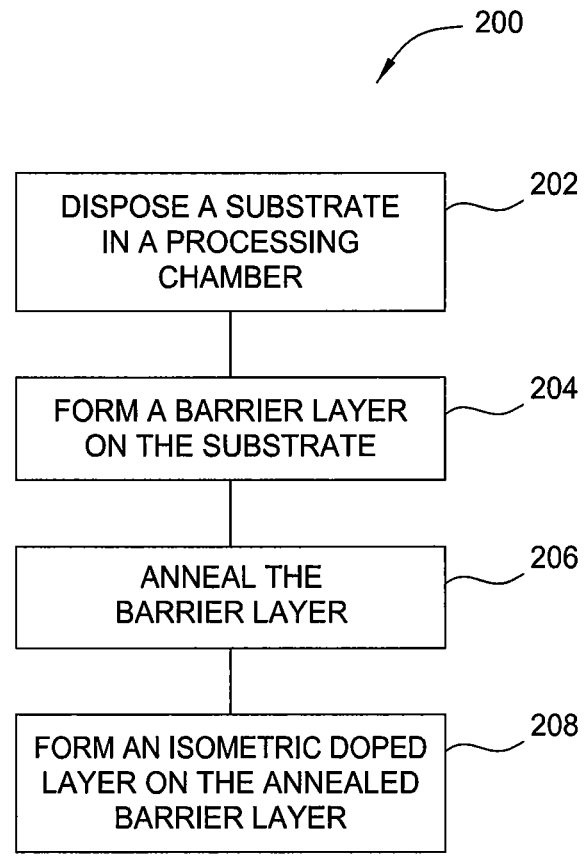
FIG. 2 is a flow diagram summarizing a method according to another embodiment.

FIG. 2 is a flow diagram summarizing a method 200 according to another embodiment. The method 200 may also be used to form a doped semiconductor layer on a substrate. At 202, a substrate is disposed in a processing chamber for processing. Any of the substrates mentioned above in connection with FIG. 1 may be beneficially subjected to the method 200. The process chamber may be any of the types of process chambers mentioned in connection with FIG. 1.

At 204, a barrier layer is formed on the substrate. In addition to having good barrier properties, the barrier layer may have a morphology that is compatible with a thermodynamically favored morphology of the doped layer to be formed over the barrier layer. In many cases, the barrier layer will have a composition similar to the doped layer. In the case of a doped semiconductor layer, a barrier layer may be formed from the same semiconductor. For example, when a doped germanium layer is to be formed on the substrate, a germanium barrier may be formed on the substrate prior to forming the doped germanium layer.

The barrier layer is generally formed by a vapor deposition process such as CVD, PVD, ALD, and the like, which may be plasma enhanced. The barrier layer may be formed by providing a barrier precursor material to the processing chamber containing the substrate, optionally with a carrier gas, and encouraging the barrier material to deposit on the substrate. The barrier layer may also be a foundation layer, as described above in connection with FIG. 1. For example, in the germanium example described above the germanium foundation layer may also be a barrier layer. Barrier properties are improved by increasing thickness, which allows the barrier layer to absorb dopants from adjacent layers without passing them into subjacent silicon, and by reduced ordering of the material. A germanium layer formed according to the process described above may have useful barrier properties if formed to a thickness between about 150 Å and about 300 Å. Additionally, reducing the ratio of carrier gas to germanium source in the process mixture reduces structural order of the layer. In the germanium example above, the ratio of the first flow rate to the second flow rate may be between about 5:1 and about 50:1 to produce a less ordered layer having barrier properties.

At 206, the barrier layer may be fully or partially annealed, or surface treated, according to any of the annealing processes described above. Exposure to electromagnetic energy increases the crystallinity of the barrier layer, restoring at least a portion of the structural order of the layer. Barrier properties may be reduced by annealing in some cases, so partial annealing or surface annealing may provide surface nucleation sites for growth of a highly ordered doped layer on the barrier layer while preserving barrier properties of the barrier layer. In one embodiment, the barrier layer may have an amorphous, microcrystalline, or multicrystalline morphology prior to annealing, and after annealing may have a highly ordered crystalline surface after a surface treatment. The remaining barrier material below the annealed surface may retain the barrier properties derived from the disorganized morphology while the ordered surface promotes growth of an ordered layer thereon. Such a barrier layer may be useful in preventing diffusion of dopants from the doped layer into subjacent layers if the doped layer is to be annealed.

At 208, the doped layer is formed on the barrier layer, substantially as described above in connection with FIG. 1.

In either of the methods 100 or 200, the substrate may be annealed following formation of the doped layer, if desired. A final annealing step may help to eliminate any defects in the formation of either the doped layer or the layer beneath the doped layer, or at the interface between the layers. A thermal annealing process such as laser annealing may be used to reduce residual defects and interstitials in the layer. The final anneal may be a melt process or a submelt process, but in most embodiments, a submelt process will anneal the layers effectively. The final anneal may be a deep anneal that treats both layers at once, or a surface anneal that anneals only the doped layer or only the surface of the doped layer. Thermal energy may be directed to the substrate through any known annealing process, including laser annealing, both continuous wave and pulsed, spike annealing, rapid thermal annealing, flash annealing, and the like.

Structures formed according to the methods described herein generally have a semiconductive foundation layer and a doped isomorphic semiconductor layer in contact with the foundation layer. The foundation layer functions as a structural template for formation of the doped layer. Dopant ions and semiconductor ions contact the substrate surface and adhere in positions that propagate the structure of the foundation layer, resulting in a doped semiconductor layer that needs little to no annealing.

Figure 3:
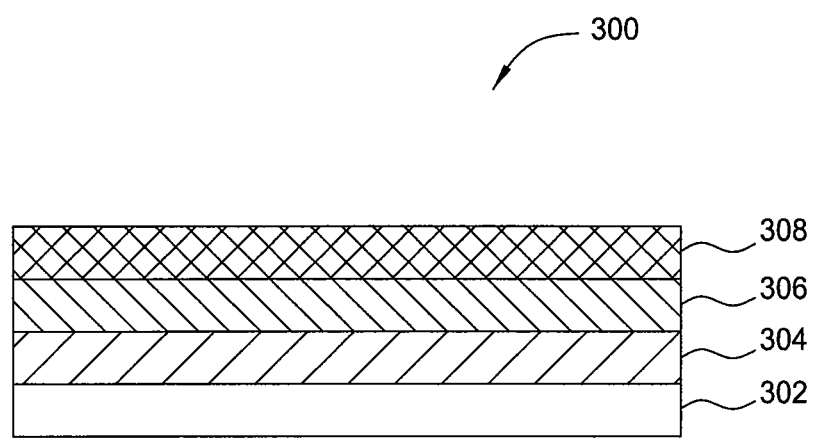
FIG. 3 is a schematic cross-sectional view of a device formed according to any of the methods described herein.

FIG. 3 is a schematic cross-sectional view of a device 300 formed according to any of the methods described herein. The device 300 comprises a semiconductor substrate 302, which may be any semiconductor material, elemental or compound, for example silicon. A foundation layer 304 is formed on the substrate 302. The foundation layer 304 is a semiconductive material, such as germanium, silicon, or a mixture thereof, and is formed according to a method that yields a highly ordered crystal structure. The foundation layer may be formed by a vapor deposition process, such as epitaxy or CVD, which may be plasma assisted, and then may be annealed to perfect the structure of the semiconductor matrix. The foundation layer is relatively thin to allow formation of small devices. The foundation layer 304 may have thickness between about 10 Å and about 300 Å, such as between about 50 Å and about 150 Å, for example about 100 Å.

A doped isomorphic semiconductor layer 306 is formed in contact with the foundation layer 304. The doped layer 306 generally comprises a semiconductor composition that is similar to, or identical to, the foundation layer 304 in order to provide a high quality interface between the foundation layer 304 and the doped layer 306. Dopants in the doped layer may be p-type dopants, such as boron, or n-type dopants, such as phosphorus or arsenic. As the dopants and semiconductor atoms and, optionally, ions deposit on the foundation layer 304, they adopt the same crystal structure arrangement as the foundation layer 304, resulting in an interface having a substantially continuous and highly ordered semiconductor matrix with a smoothly varying concentration of active dopants incorporated therein. Because the dopants naturally adopt positions at nodes of the crystal structure, and because the resulting structure has minimal defects, the need to anneal the doped layer 306 is minimized. Silicon and germanium both naturally adopt a diamond cubic crystal structure, which is substantially preserved across the interface between the foundation layer 304 and the doped layer 306.

A logic structure 308 may be formed over the doped isomorphic semiconductor layer 306. The logic structure 308 generally comprises a gate material and an electrode, as is generally known in the art. Other types of devices that beneficially use high quality doped layers may also be formed using the methods described herein. Examples of such devices include memory devices, photovoltaic devices, and electrochemical devices.

Layers of phosphorus-doped germanium have shown reduced resistivity when deposited over annealed germanium rather than silicon. When a phosphorus-doped germanium layer was deposited over an annealed germanium layer about 100 Å thick by flowing phosphine at a flow rate between about 1 sccm and about 20 sccm with a 10% germane in hydrogen mixture at about 1 sLm and a separate hydrogen flow of about 1 sLm to about 10 sLm for 900 seconds at about 400° C., the observed resistivity of the layer was between about 10% and about 25% of the same layer deposited over a silicon base.

While the foregoing is directed to embodiments of the invention, other and further embodiments of the invention may be devised without departing from the basic scope thereof.

What is claimed is:

1. A method of treating a semiconductor substrate, comprising:
   forming a barrier layer on a substrate to a thickness of between about 150 Å and about 300 Å, wherein forming the barrier layer comprises exposing the substrate to a process gas mixture comprising hydrogen gas at a first volumetric flow rate, germanium hydride gas at a second volumetric flow rate, and a halide gas at a third volumetric flow rate, and wherein a ratio of the first volumetric flow rate to the second volumetric flow rate is between about 5:1 and about 50:1;
   annealing a surface of the barrier layer; and
   forming an isomorphic doped layer on the annealed surface of the barrier layer.

2. The method of claim 1, wherein the substrate comprises silicon and the barrier layer comprises germanium.

3. The method of claim 2, wherein forming the barrier layer comprises disposing the substrate in a processing chamber and exposing the substrate to a process gas mixture comprising germanium at a temperature below about 500° C.

4. The method of claim 3, wherein annealing a surface of the barrier layer comprises increasing a temperature of the barrier layer above about 600° C.

5. The method of claim 1, wherein the barrier layer is undoped germanium and the isomorphic doped layer is doped germanium.

6. The method of claim 5, wherein forming the barrier layer comprises disposing the substrate in a processing chamber and exposing the substrate to a process gas mixture comprising a germanium compound at a temperature below about 500° C.

7. The method of claim 6, wherein the process gas mixture further comprises a halide compound and a carrier gas.

8. The method of claim 7, wherein annealing the surface of the barrier layer comprises reducing a flow rate of the germanium compound and forming the isomorphic doped layer comprises adding a flow rate of a dopant compound to the process gas mixture.

9. The method of claim 8, wherein the dopant compound is a phosphorus containing compound or an arsenic containing compound.

10. The method of claim 8, wherein the dopant compound is phosphine.

11. The method of claim 6, wherein annealing the surface of the barrier layer comprises increasing a temperature of the barrier layer above about 600° C. and reducing a flow rate of the germanium compound.

12. The method of claim 1, wherein a ratio of the second volumetric flow rate to the third volumetric flow rate is between about 1:1 and about 150:1.

13. The method of claim 1, wherein the germanium hydride is provided in a mixture with hydrogen gas.

14. The method of claim 1, wherein the annealing the surface of the barrier layer is adapted to form a highly ordered crystalline surface while remaining material of the barrier layer below the annealed surface exhibits a disorganized morphology.

15. A method of forming a material layer on a semiconductor substrate, comprising:
   forming a germanium layer on a substrate to a thickness of between about 150 Å and about 300 Å, wherein forming the germanium layer comprises exposing the substrate to a process gas mixture comprising hydrogen gas at a first volumetric flow rate, germanium hydride gas at a second volumetric flow rate, and a halide gas at a third volumetric flow rate, and wherein a ratio of the first volumetric flow rate to the second volumetric flow rate is between about 5:1 and about 50:1;
   annealing a surface of the germanium layer; and
   forming a doped epitaxial germanium layer on the annealed surface of the substrate.

16. The method of claim 15, further comprising annealing the doped epitaxial germanium layer.

17. The method of claim 15, wherein annealing the substrate comprises discontinuing the halide gas, reducing the second volumetric flow rate of the germanium hydride gas, and increasing a temperature of the substrate.

18. The method of claim 16, wherein forming the doped epitaxial germanium layer on the substrate comprises increasing the second volumetric flow rate of the germanium hydride and adding a dopant source to the process gas mixture.

19. The method of claim 15, wherein the annealing the surface of the germanium layer is adapted to form a highly ordered crystalline surface while remaining material of the germanium layer below the annealed surface exhibits a disorganized morphology.

* * * * *

UNITED STATES PATENT AND TRADEMARK OFFICE
CERTIFICATE OF CORRECTION

PATENT NO.      : 8,822,312 B2  
APPLICATION NO. : 13/482725  
DATED           : September 2, 2014  
INVENTOR(S)     : Huang et al.

Page 1 of 1

It is certified that error appears in the above-identified patent and that said Letters Patent is hereby corrected as shown below:

**On the Title Page, Item (*) Notice:**

Please insert -- This patent is subject to a terminal disclaimer. -- after 100 days.;

In Claims:

Column 8, Claim 18, Line 47, please delete "16" and insert -- 17 -- therefor.

Signed and Sealed this  
Seventeenth Day of February, 2015

Michelle K. Lee  
*Deputy Director of the United States Patent and Trademark Office*